United States Patent
Gogl et al.

(10) Patent No.: US 6,826,075 B2
(45) Date of Patent: Nov. 30, 2004

(54) RANDOM ACCESS SEMICONDUCTOR MEMORY WITH REDUCED SIGNAL OVERCOUPLING

(75) Inventors: Dietmar Gogl, Fishkill, NY (US); Thomas Röhr, Aschheim (DE); Heinz Hönigschmid, East Fishkill, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/905,853

(22) Filed: Jul. 13, 2001

(65) Prior Publication Data

US 2002/0012266 A1 Jan. 31, 2002

(30) Foreign Application Priority Data

Jul. 13, 2000 (DE) .......................................... 100 34 083

(51) Int. Cl.[7] .............................. G11C 5/06; G11C 11/14
(52) U.S. Cl. .......................................... 365/158; 365/69
(58) Field of Search ........................ 365/69, 158, 171, 365/173

(56) References Cited

U.S. PATENT DOCUMENTS

| 3,604,109 A | * | 9/1971 | Crimmins .................... 29/604 |
| 4,238,838 A | * | 12/1980 | Wright et al. ................ 365/207 |
| 4,914,502 A | * | 4/1990 | Lebowitz et al. ............ 257/773 |
| 4,977,542 A | | 12/1990 | Matsuda et al. ............. 365/207 |
| 5,640,343 A | | 6/1997 | Gallagher et al. ........... 365/171 |
| 5,804,854 A | | 9/1998 | Jung et al. ................... 257/321 |
| 5,982,658 A | | 11/1999 | Berg et al. ................... 365/158 |
| 6,259,621 B1 | * | 7/2001 | Li et al. ...................... 365/171 |

FOREIGN PATENT DOCUMENTS

| DE | 198 49 938 A1 | 7/1999 |
| JP | 09 293 373 A | 11/1997 |
| WO | WO 99/14760 | 3/1999 |

* cited by examiner

Primary Examiner—Anh Phung
Assistant Examiner—J. H. Hur
(74) Attorney, Agent, or Firm—Laurence A. Greenberg; Werner H. Stemer; Ralph E. Locher

(57) ABSTRACT

A memory matrix has at least one cell array including column lines and row lines. Memory elements are situated at points where the row lines and column lines intersect one another. In each case two adjacent lines are guided such that they cross one another in such a way that the two lines change their spatial configurations in sections along the direction in which they run. Thus an overcoupling of signals between the lines is minimized.

17 Claims, 9 Drawing Sheets

| Column | A | | B | | C | | D | | E | | Σ |
|---|---|---|---|---|---|---|---|---|---|---|---|
| | l | r | l | r | l | r | l | r | l | r | |
| 4 | 0 | -2 | 0 | -4 | 0 | -4 | 0 | -4 | 0 | -2 | -16 |
| 5 | -2 | -2 | -4 | -4 | -4 | -4 | -4 | -4 | -2 | -2 | -32 |
| 6 | -2 | -2 | -4 | -4 | -4 | -4 | -4 | -4 | -2 | -2 | -32 |
| 7 | -2 | 0 | -4 | 0 | -4 | 0 | -4 | 0 | -2 | 0 | -16 |

| Column | A | | B | | C | | D | | E | | Σ |
|---|---|---|---|---|---|---|---|---|---|---|---|
| | l | r | l | r | l | r | l | r | l | r | |
| 4 | 0 | -2 | 0 | -4 | 0 | -4 | 0 | -4 | 0 | -2 | -16 |
| 5 | -2 | -2 | -4 | +4 | -4 | -4 | -4 | +4 | -2 | -2 | -16 |
| 6 | -2 | -2 | +4 | -4 | -4 | -4 | +4 | -4 | -2 | -2 | -16 |
| 7 | -2 | 0 | -4 | 0 | -4 | 0 | -4 | 0 | -2 | 0 | -16 |

| Column | A | | B | | C | | D | | E | | Σ |
|---|---|---|---|---|---|---|---|---|---|---|---|
| | l | r | l | r | l | r | l | r | l | r | |
| 4 | 0 | -2 | -4 | -4 | -4 | 0 | 0 | 0 | 0 | 0 | -14 |
| 5 | -2 | -2 | 0 | -4 | 0 | 0 | 0 | 0 | 0 | 0 | -8 |
| 6 | -2 | -2 | -4 | 0 | 0 | 0 | 0 | 0 | 0 | 0 | -8 |
| 7 | -2 | 0 | -4 | -4 | 0 | -4 | 0 | 0 | 0 | 0 | -14 |

RANDOM ACCESS SEMICONDUCTOR MEMORY WITH REDUCED SIGNAL OVERCOUPLING

BACKGROUND OF THE INVENTION

Field of the Invention

The invention relates to memory matrices, in particular memory matrices for MRAMs (Magnetoresistive Random Access Memory), i.e. nonvolatile magnetic memory elements including magnetic tunneling elements.

Random access semiconductor memories usually have a cell array including a matrix of column and row lines. Memory cells are provided at points where the column lines and the row lines intersect one another. In an MRAM, magnetic tunneling elements are typically used as memory elements.

Such a TMR element (TMR: tunneling magnetoresistance) includes, in principle, two magnetic layers, a hard-magnetic and a soft-magnetic layer. These layers are separated from one another by an insulating intermediate layer having a thickness of only a few atomic layers. The magnetizations in the two layers may be either in the same direction or oppositely directed. The insulating barrier between the magnetic layers is so thin that after a voltage has been applied, some electrons can pass through it. A so-called tunneling current flows. In this case, the intensity of the tunneling current depends on the orientation of the magnetization directions with respect to one another.

Data can be read from such a TMR element without altering the memory state thereof. Such a memory is written to by applying electric current to define the magnetization direction of the so-called "soft" magnetic layer. The content of the memory element is determined by the direction of the current. The currents required are relatively high (approximately 2.5 mA) particularly in the case of writing since the magnetization has to be effected by the magnetic field of a conductor through which current flows.

When writing to a TMR memory element, electric currents flow through the corresponding column and row lines, in which case only the column and row currents together can change the magnetization of the soft magnetic layer. In order to read the content of a memory cell, a voltage is passed onto the word line and the voltage drop across the tunneling resistance is measured, which represents the content of the memory cell.

In semiconductor memories, decoding the addresses is less complex in terms of circuitry if the respectively selected column lines lie directly next to one another. In the event of an access, however, it is then the case that the lines are also addressed simultaneously and have a corresponding signal applied to them. The problem then arises that, in the event of a current change, e.g. switching-on of the current flow, on one line, a corresponding interference current pulse is induced by inductive coupling on the neighboring line. This is particularly detrimental if opposite currents flow on the adjacent lines, because the induced interference currents then exactly counteract the actual write current. The degree of interference of the adjacent lines is particularly high if the logic levels "zero" and "one" alternate with one another on the adjacent lines, i.e. the current direction reverses.

SUMMARY OF THE INVENTION

It is accordingly an object of the invention to provide a memory matrix which overcomes the above-mentioned disadvantages of the heretofore-known memory matrices of this general type and which reduces the negative effect of overcoupling from one line onto an adjacent line.

With the foregoing and other objects in view there is provided, in accordance with the invention, a memory matrix, including:

at least one cell array including lines, the lines including column lines and row lines;

the column lines and the row lines crossing one another at respective intersection points;

memory elements provided at the intersection points;

at least two of the lines having a relative position with respect to one another, the relative position with respect to one another changing along the at least two of the lines; and the at least two of the lines are at least two of the column lines or at least two of the row lines.

In other words, the object of the invention is achieved by a memory matrix having at least one cell array including column lines and row lines at each of whose points of intersection memory elements are situated, the row lines and/or the column lines of a cell array in each case being disposed next to one another, wherein at least two column or row lines change their spatial configuration or position with respect to one another.

By virtue of the fact that, according to the invention, the respectively adjacent lines change their configurations in the direction in which they run, the effect achieved is that, with respect to a line, at least one of the adjacent lines changes. As a result of this, one line does not have the same neighboring lines across the entire cell array. This is advantageous in the event of simultaneous addressing of adjacent lines, as usually occurs during address decoding, because undesirable overcoupling or crosstalk effects between two lines can thus be reduced.

This change in the spatial configuration or relative positioning of adjacent lines advantageously is achieved by two lines in each case being crossed, since crossing two adjacent lines is the simplest realization in technological terms.

According to one embodiment of the invention, the memory matrix has a first and a second cell array, which are stacked in layers one above the other, in each case the column and/or the row lines of different layers essentially being opposite one another. Such stacking has the advantage that the storage density per chip area can be increased.

Preferably, a line is multiply crossed with an arbitrary and not always the same one of the column and/or row lines that are respectively provided alongside, i.e. the lines interchange their respective positions with one another by crossing one another. This makes it possible to achieve a further reduction of the coupling values between the lines originally disposed next to one another.

Besides changing the configuration of lines within a memory layer, in the case of a multilayer embodiment, such a change of the configuration can also be effected with regard to lines of another memory layer. This reduces the negative effect of overcoupling between adjacent lines of memory layers that are opposite one another.

In a further embodiment, the changing of the spatial to configuration of respectively different, adjacent column and/or row lines is only effected among the lines in a partial region of the column and row lines which is activated in the event of a memory access. This is advantageous because this allows a maximum decoupling between the lines of the partial region to be achieved with a small number of changes in the configuration, i.e. changes in the positioning of the lines. It suffices to reduce only the overcoupling within these segments, i.e. a plurality of lines that are adjacent or logically assigned to one another, because the segments are addressed only in succession. Lines that are addressed only simultaneously can influence one another. Unswitched or deenergized lines have no significant influence on the switching properties of the active lines. The active lines also do not influence the contents of the memory elements on the adjacent inactive lines. Nevertheless, relatively good decoupling is achieved for a multiplicity of possible bit patterns.

Preferably, it may be provided that the memory matrix is constructed, with regard to the changes of the spatial configuration of its lines, such that the order of the column and/or row lines is the same at opposite edges of the memory matrix. This makes it possible to avoid an additional circuit outlay in the realization of address decoders. Such an additional circuit outlay arises if the address lines are unordered or have an order which deviates from the original order. This is important in particular because, in the case of MRAM memories, circuitry of the column and row lines at both edges of the cell array is expedient. Furthermore, it may preferably be provided that the cell arrays or their column and/or row lines are mirror-symmetrical with respect to the changes in their configuration.

Furthermore, it may be provided that the edge region of the cell array includes lines which do not change their configuration.

Other features which are considered as characteristic for the invention are set forth in the appended claims.

Although the invention is illustrated and described herein as embodied in a random access semiconductor memory with a reduced signal overcoupling, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2a is a diagrammatic plan view of a detail of a cell array without a crossing of the lines according to the prior art;

FIG. 2b is a table illustrating the orders of magnitude of the overcoupling between the column lines in the case of a cell array according to FIG. 2a;

FIG. 3a is a diagrammatic plan view of a detail of a cell array with crossing of in each case two adjacent column lines;

FIG. 3b is a table illustrating the order of magnitude of the overcoupling between the column lines in the case of a cell array according to FIG. 3a;

FIG. 4a is a diagrammatic plan view of a detail of a cell array with multiple crossing of a plurality of bit lines;

FIG. 4b is a table illustrating the orders of magnitude of the overcoupling between the column lines in the case of a cell array according to FIG. 4a;

DESCRIPTION OF THE PREFERRED EMBODIMENTS

Figure 1A:
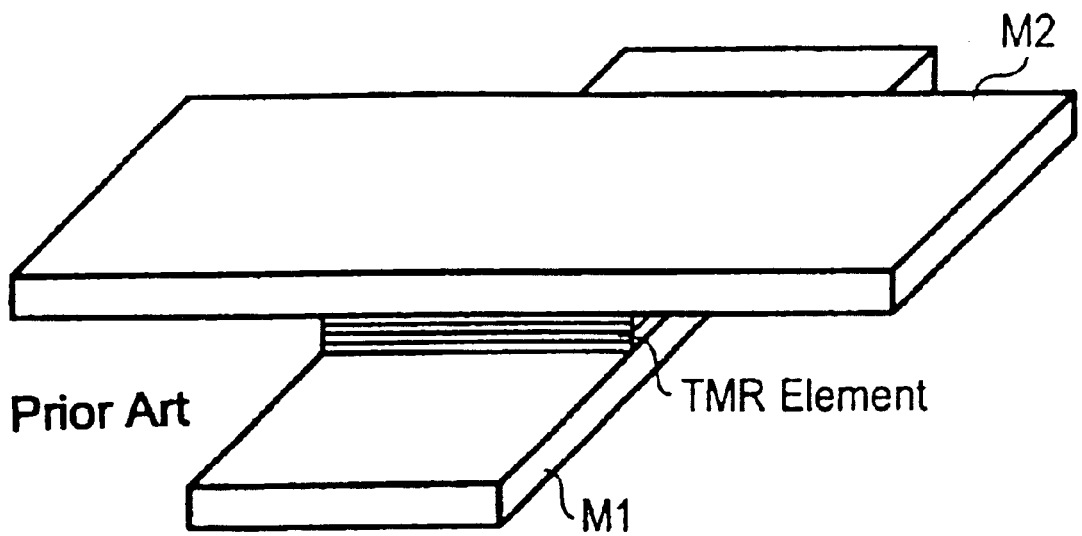
FIG. 1a is a diagrammatic perspective view of a magnetic TMR element according to the prior art.
Figure 1B:
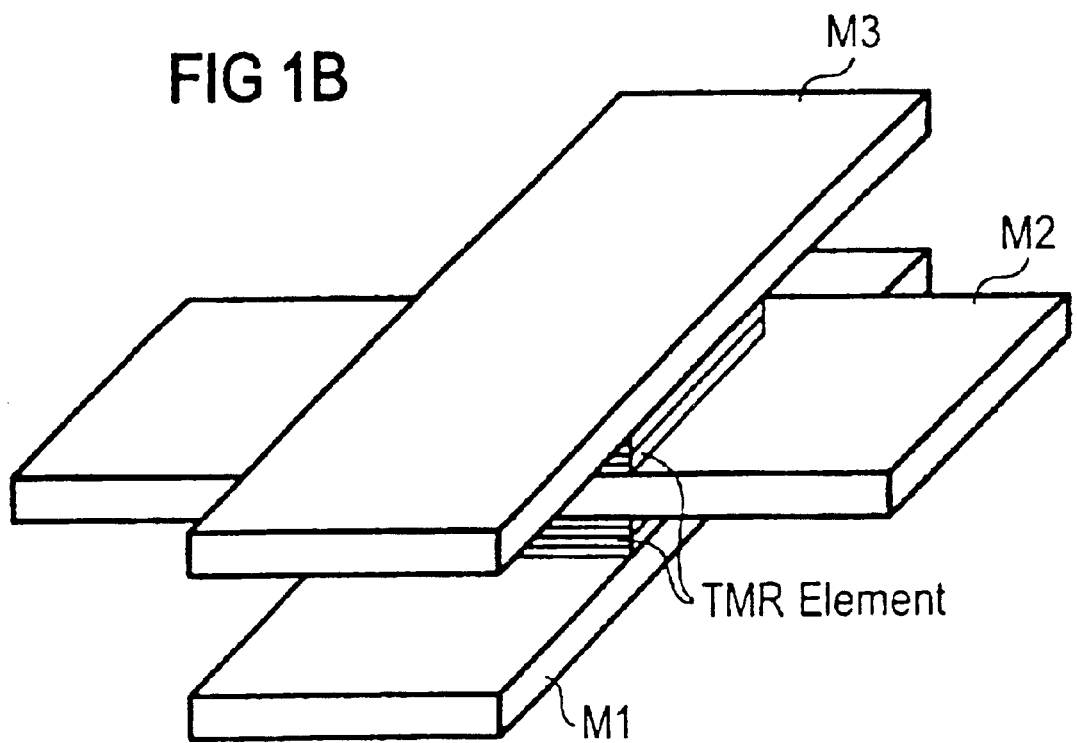
FIG. 1b is a diagrammatic perspective view of two magnetic TMR elements provided in two layers one above the other.

Referring now to the figures of the drawings in detail and first, particularly, to FIG. 1a thereof, there is shown a TMR element according to the prior art, M1 and M2 representing the column and row lines for addressing, writing to and reading from a memory element. By stacking a plurality of such memory elements one above the other, it is possible to increase the storage density per chip area. This is shown for two layers in FIG. 1b. For this purpose, a further column line plane M3 has been inserted. It is also conceivable to stack more than two TMR elements.

It is typical in semiconductor memories to store not just one but a plurality of bits per address, i.e. a plurality of memory cells are simultaneously read from or written to within a cell array of a semiconductor memory. FIG. 2 shows an example of the simultaneous writing to four TMR cells of an MRAM. Column lines 0–15 and row lines 0–15 are illustrated. The cell array is divided in regions or sectors A–E.

In the example shown, write currents flow through the column lines 4, 5, 6 and 7 and also through a row line 8, with the result that the four memory cells identified by circles are written to. Depending on whether a logic "zero" or logic "one" is intended to be written, the flow direction of the current through the column lines is negative or positive and, consequently, the respective magnetization is in the same direction or directed oppositely with respect to the magnetization of the hard-magnetic layer. In the example in FIG. 2, a "one" is written to the column lines 4 and 6 and a "zero" is written to the column lines 5 and 7.

Figures 3A, 3B:
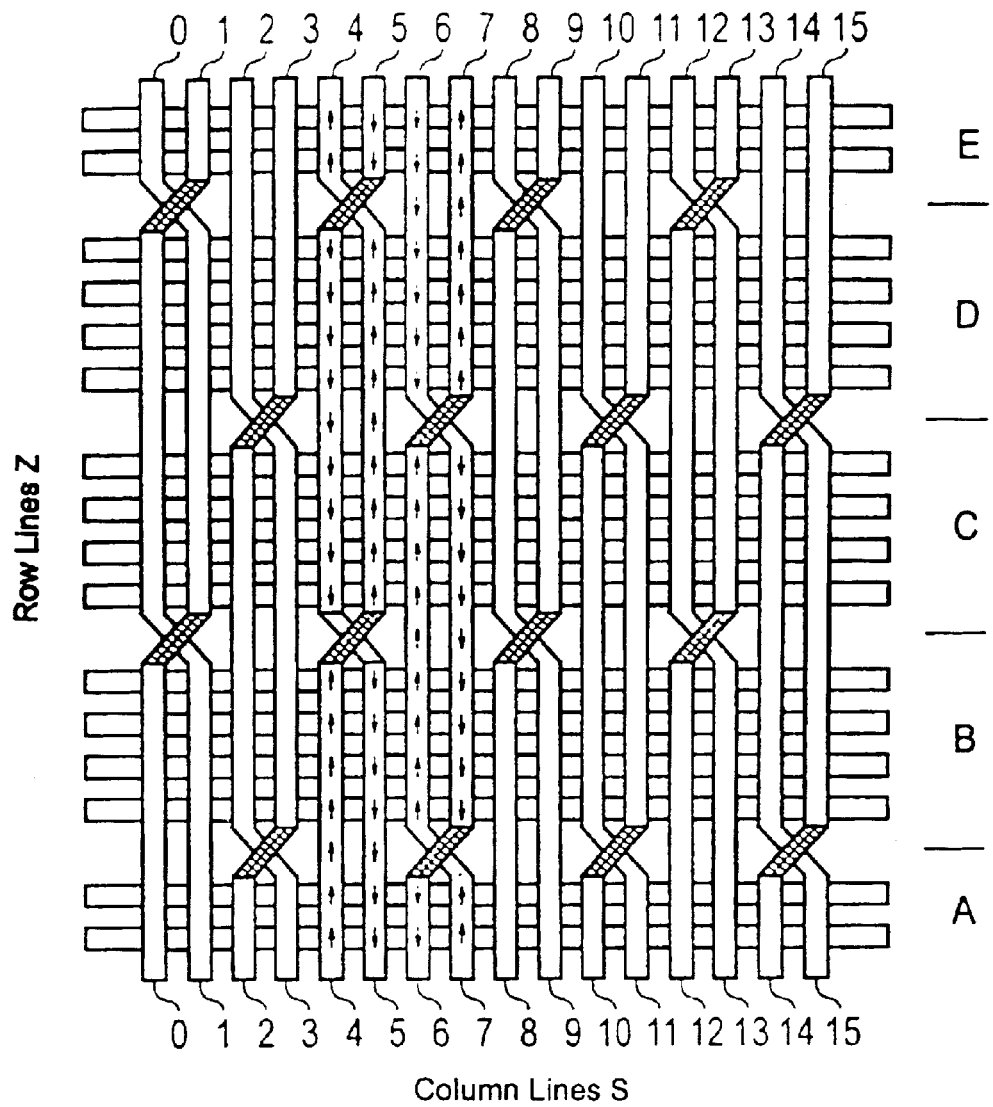

In a first embodiment according to the invention, which is shown in FIG. 3a, a nonvolatile magnetic semiconductor memory is constructed from a matrix of column lines S and row lines Z. The TMR element is situated at the points of intersection of each column line S and row line Z. In the embodiment shown, in each case two adjacent column lines S are crossed with one another once or a number of times, with the result that the lines interchange their positions in the course of their further progression. As already explained above, this means that, for a crossed line, at least one of its directly neighboring lines changes. In the case of the example that was considered above and is identified by the marking A in FIG. 3a, the effect of the crossing of the lines 2 and 3 is that the constellation of the neighboring lines for the lines 1, 2 3 and 4 changes simultaneously.

Current changes on adjacent lines affect adjacent lines through overcoupling by an alternating magnetic field being generated which, for its part, induces a current flow in adjacent lines. In the case of a memory matrix including column and row lines, interfering induced currents arise principally when writing to a plurality of memory elements as a result of currents on adjacent column lines. The greater the length over which two adjacent, approximately parallel lines can influence one another, the higher the induced interference currents there. In particular in the case of the relatively high write currents in MRAMS of 2.5 mA, for example, these overcoupling effects can impair the mode of operation of the device, or at least considerably retard the write cycle, since the required current flow is present only after the induced interference has decayed.

The effect achieved by the crossing of adjacent lines is, then, that current changes do not influence one another over the entire length of the line and the negative effect of overcoupling is thus reduced.

Upon close consideration of the column lines 4 and 5 of the cell matrix of FIG. 3a, it can be seen that the courses of the column lines 4 and 5 cross one another twice. Equally, the adjacent column line pairs 2 and 3, and 6 and 7, are also crossed with one another in such a way that the locations of their crossings are offset with respect to the crossings of the column lines 4 and 5. The consequence of this is that, in the exemplary embodiment shown, the neighboring lines of the column lines 4 and 5 change four times over the sectors A to E. In the example of the column line 4, the respectively adjacent column lines change from column lines 3 and 5 in sector A, to the column lines 2 and 5 in sector B, to the column lines 5 and 7 in sector C, to the column lines 5 and 6 in sector D and once again to the column lines 3 and 5 in sector E.

Figures 2A, 2B:
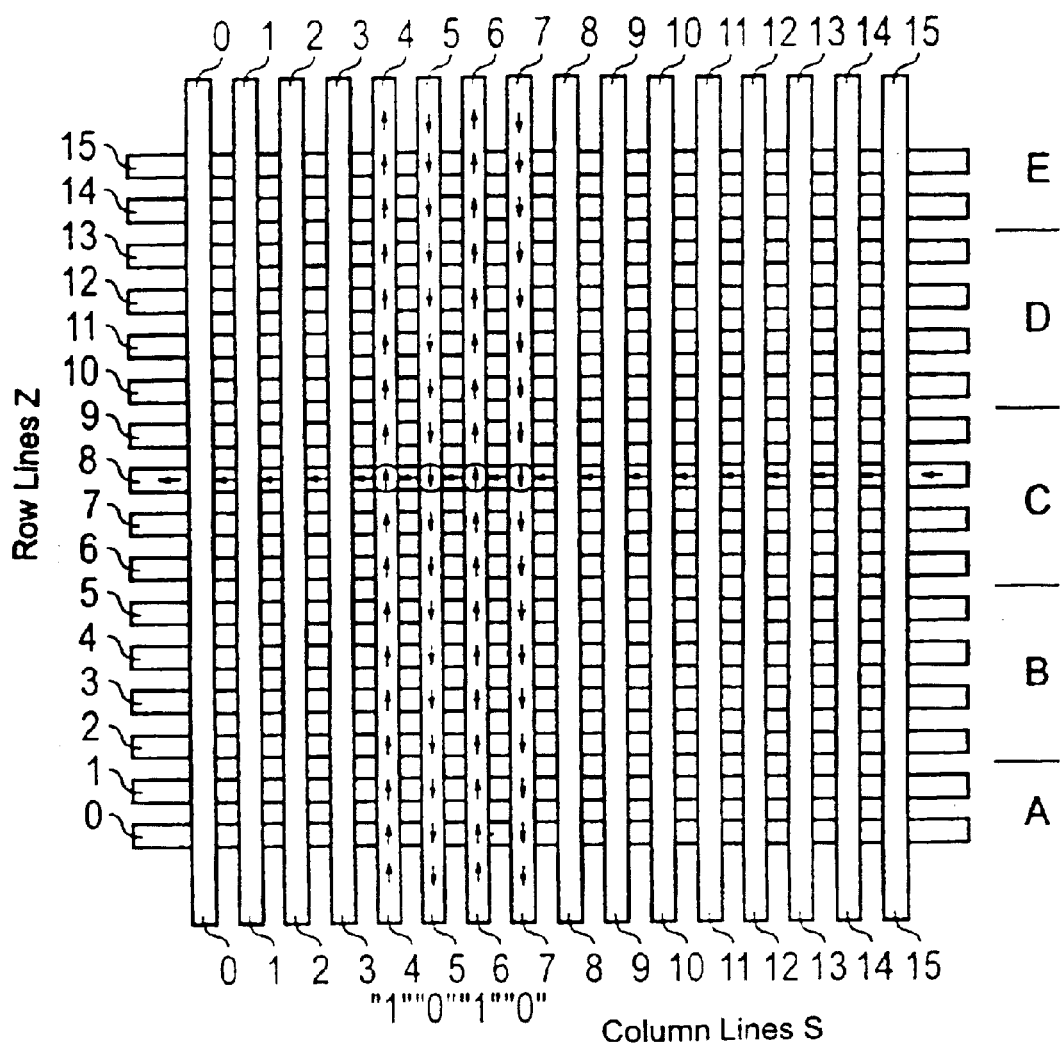
Figures 4A, 4B:
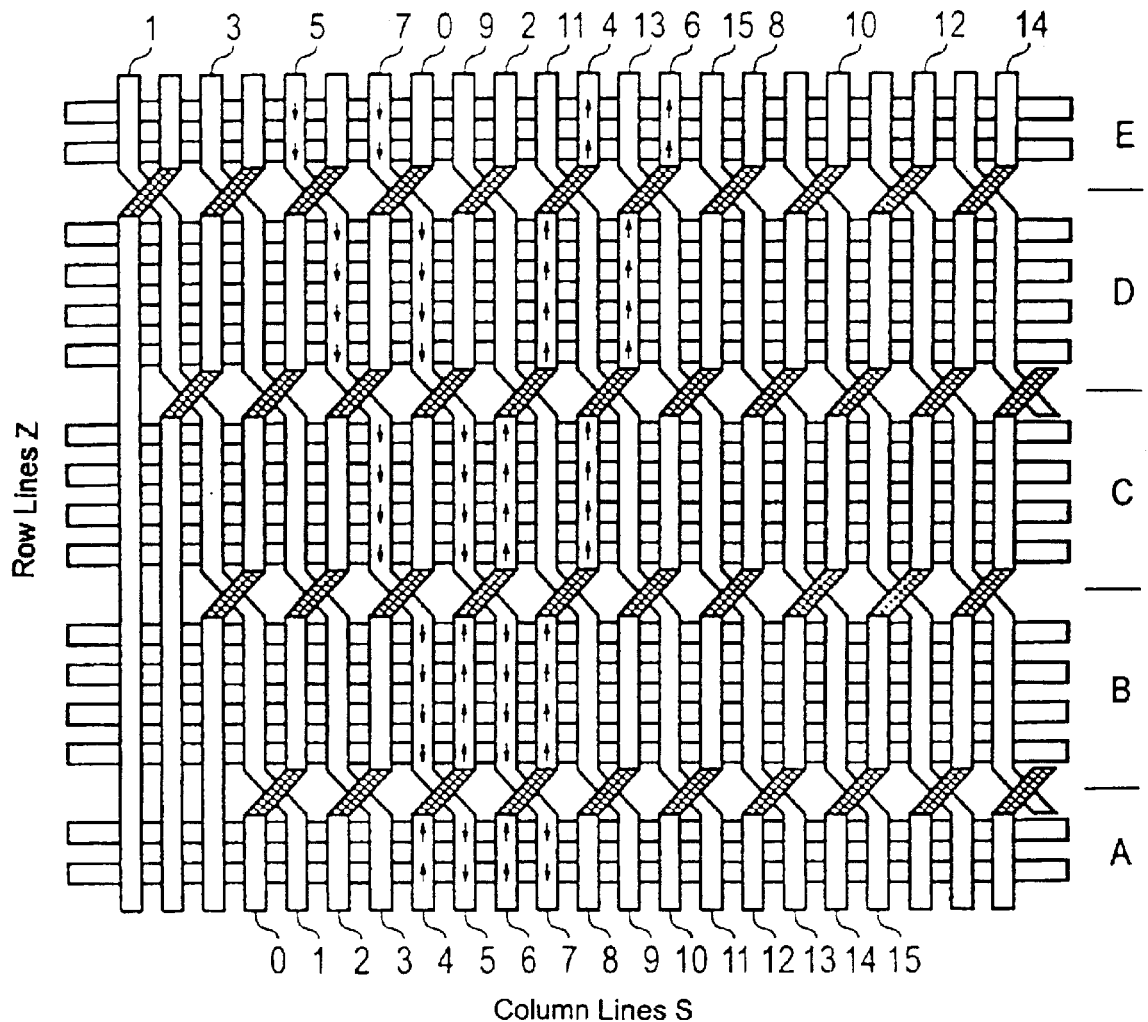

In the tables shown in FIGS. 2b, 3b and 4b, the orders of magnitude of overcoupling are estimated for the shown bit pattern 1010 of a simultaneously written data packet for cell arrays with non-crossed lines (FIG. 2a), with lines respectively crossed in pairs (FIG. 3a), and with lines that are multiply crossed with one another (FIG. 4a). If adjacent lines have opposite current flow directions, the magnitude is "–1", and is "+1" in the event of a uniform current flow direction, and is "0" in the event of a deenergized neighboring line with no current flow—in each case referring to a unit of length—(here a row). Lower magnitudes of the coupling values signify lower overcoupling.

In the case of the configuration of FIG. 2a without crossings, for the line bundle considered (lines 4 to 7) a coupling value of $\Sigma=-16$ results for the edge lines (4 and 7) and a coupling value of $\Sigma=-32$ results for the lines (5 and 6) in the middle.

For the configuration of FIG. 3a, in which a line pair in each case has crossings, the coupling value is uniformly reduced to $\Sigma=-16$ for all of the lines (see FIG. 3b).

A further exemplary embodiment is shown in FIG. 4a. Two adjacent column lines are crossed there not only among one another but also in each case in such a way that column lines that originally do not lie next to one another are also crossed with one another in their course. First we will consider the current-carrying lines 4 to 7. Between the regions A and B, firstly the adjacent column line pairs 4 and 5, and 6 and 7, are crossed with one another, after which the initially (in region A) inner lines 4 and 5 now respectively have the deenergized neighboring lines 2 and 9. Between the regions B and C, however, the line pairs 2 and 5, 4 and 7, and 6 and 9, are then crossed with one another, and it can be seen that the originally inner lines 5 and 6 now have no current-carrying neighboring lines. Between the regions C and D, the line pairs 0 and 5, 2 and 7, 4 and 9, and 6 and 11, are crossed with one another, etc. As a result, all lines originally lying next to one another are separated from one another. As is evident from FIG. 4b, the calculated coupling values are reduced to $\Sigma=-14$ or $-8$.

Figure 5:
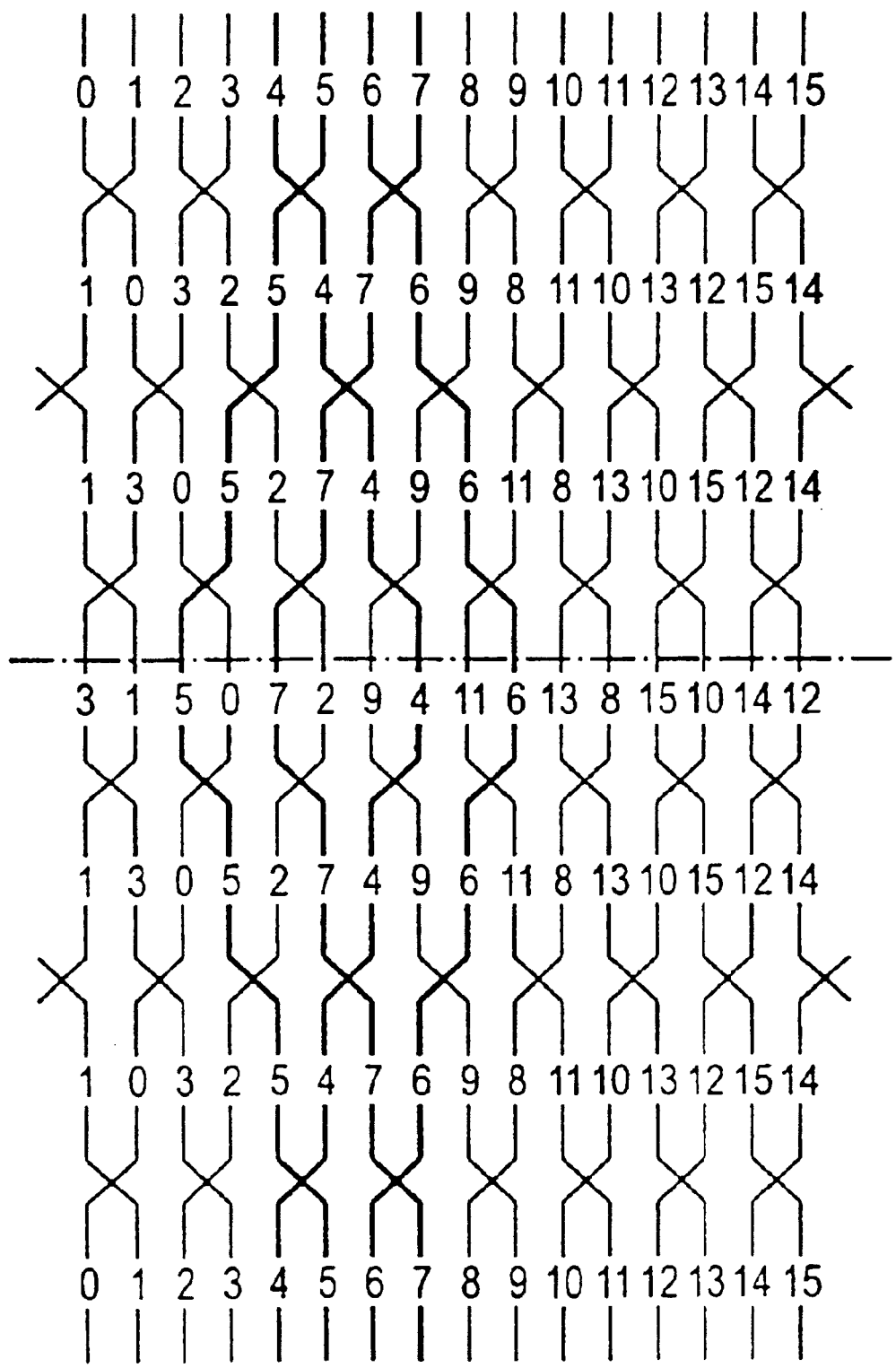
FIG. 5 is a schematic plan view of a mirror-symmetrical configuration of two cell arrays in accordance with FIG. 4a, the order of the column lines at the upper edge identically corresponding to that at the lower edge.
Figure 6A:
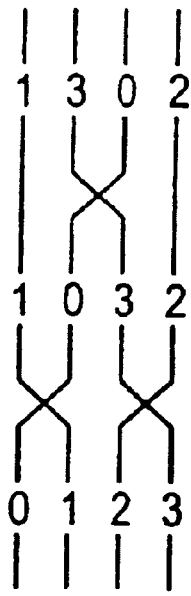
FIGS. 6a–6h are schematic plan views of in each case a bundle of four column lines which are jointly activated in the event of a memory access, the column lines being crossed only within the bundle.
Figure 6B:
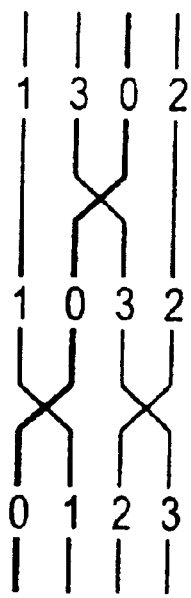
Figure 6C:
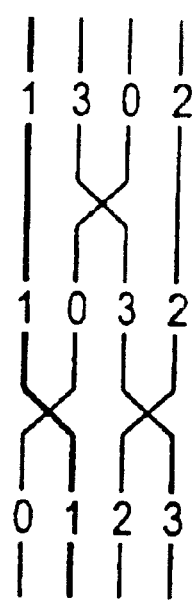
Figure 6D:
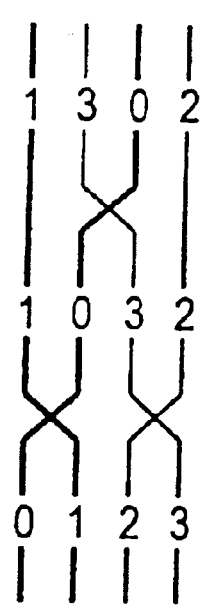
Figure 6E:
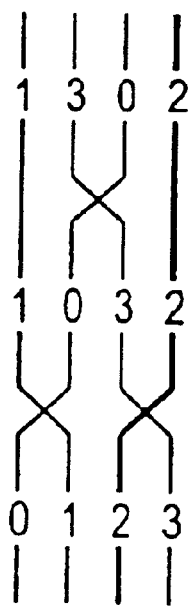
Figure 6F:
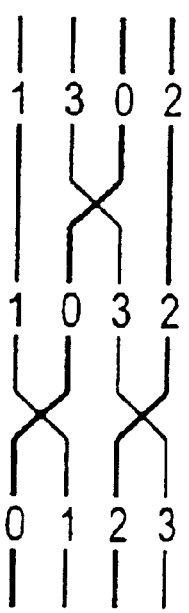
Figure 6G:
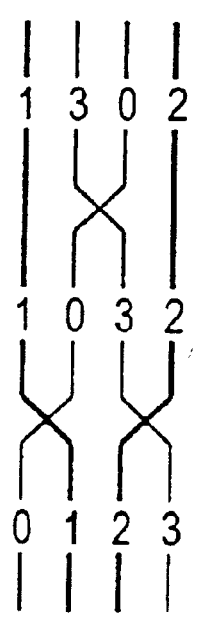
Figure 6H:
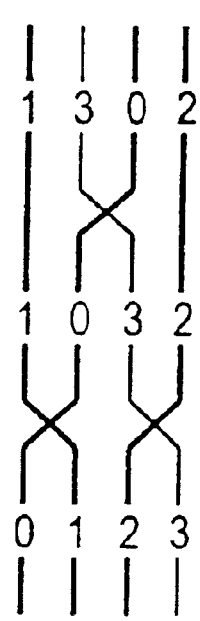

This crossing scheme has the result, however, that the order of the column lines at the upper edge of the matrix is not identical to that at the lower edge. In order to configure the decoding of the addresses, i.e. the assignment of the memory address to the selected column lines 4, 5, 6 and 7, as simply as possible in terms of circuitry, i.e. with the lowest possible area outlay, it is advantageous, however, for the selected column lines to lie directly next to one another. That should be achieved as far as possible for both ends of the column lines, since two-sided circuitry for the respective lines is expedient for the purpose of compensating for parasitic currents. In the case of FIG. 4a, the order of the column lines at the upper end of the cell matrix is unordered and the realization of an address decoder is therefore complex. This disadvantage can be eliminated by two cell arrays with the same crossing scheme being placed together in a mirror-inverted manner. This is illustrated diagrammatically in FIG. 5, the broken line representing the imaginary mirror line. The order of the column lines S at the upper edge corresponds to the order of the column lines S at the lower edge.

In a further exemplary embodiment, it may be provided that the crossings are implemented only within a plurality of lines that are provided next to one another or above one another. This may be expedient because a memory access is effected block by block and in each case only the column lines that are provided next to one another or above one another are activated simultaneously.

Figure 7A:
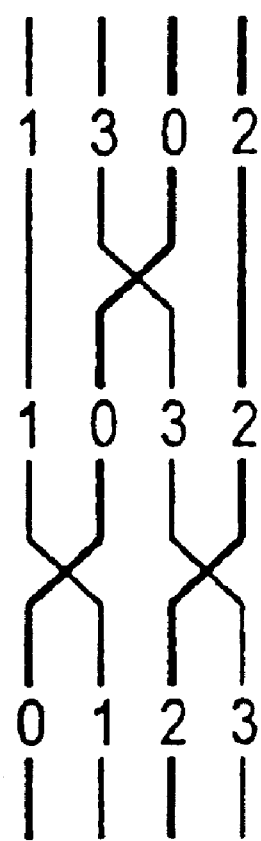
FIGS. 7a–7c are schematic plan views of favorable crossing configurations for bundle sizes of 4, 8 and 16 column lines, respectively.
Figure 7B:
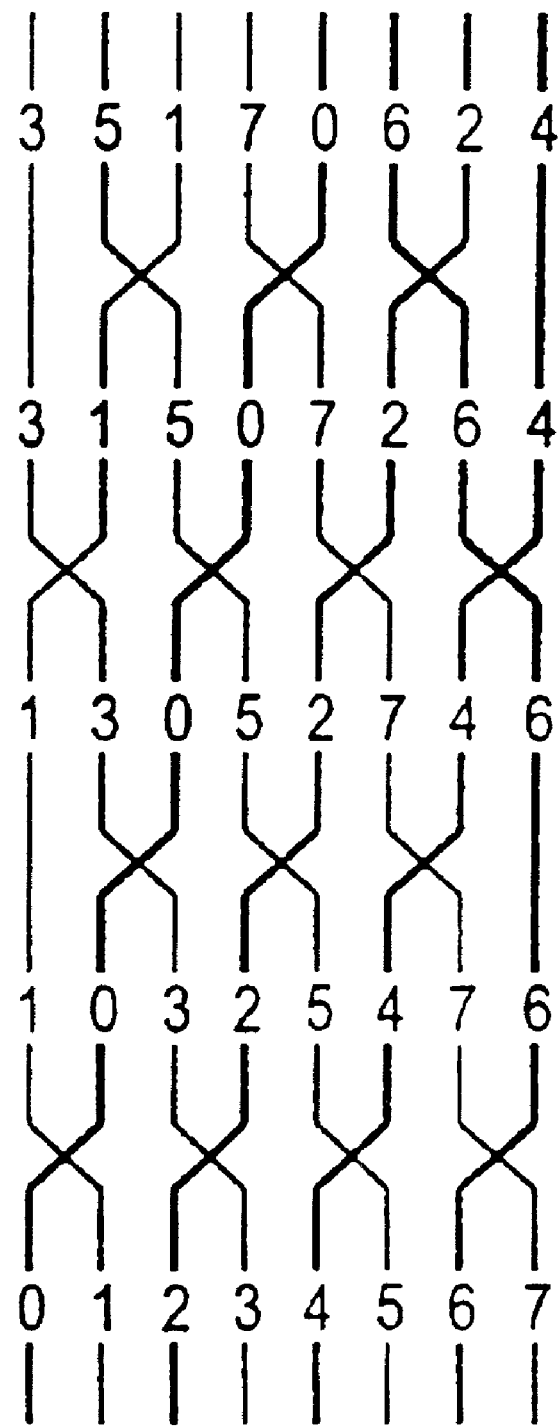
Figure 7C:
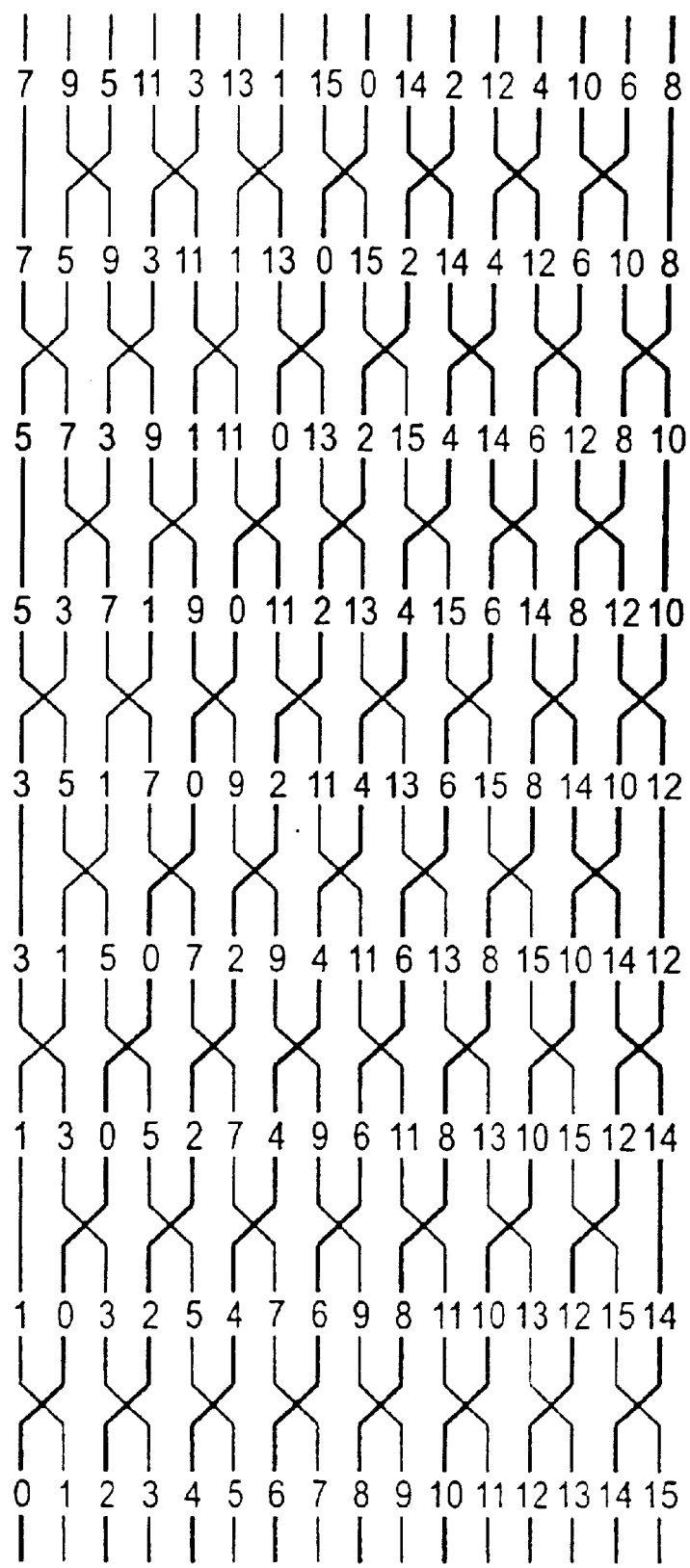

FIGS. 6a–6h show the crossing in a bundle of four column lines. The thin lines in this case correspond to a logic "zero" or a negative current flow and the bold lines correspond to a logic "one" or a positive current flow. It can be seen that a relatively uniform distribution of adjacent and non-adjacent regions and also of the edge regions is produced for all the bit patterns shown. The four lines are therefore decoupled relatively well for all possible bit patterns. This favorable configuration is achieved after two crossings for four lines (FIG. 7a); four crossings are necessary in the case of eight lines (FIG. 7b); eight crossings are necessary in the case of 16 lines (FIG. 7c); or generally $2^{n-1}$ crossings are necessary in the case of $2^n$ lines. As a result, the number of crossings can be reduced and, at the same time, good and uniform reduction of the overcoupling can be ensured.

Figure 8A:
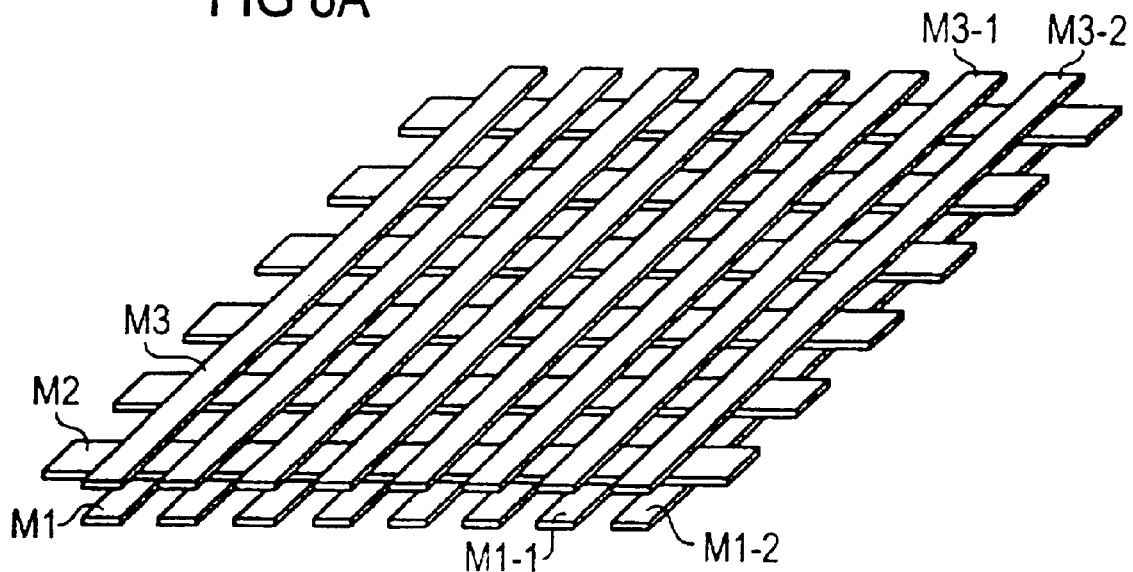
FIG. 8a is a diagrammatic perspective view of a possible configuration of two cell arrays in which two memory elements are in each case stacked one above the other.
Figure 8B:
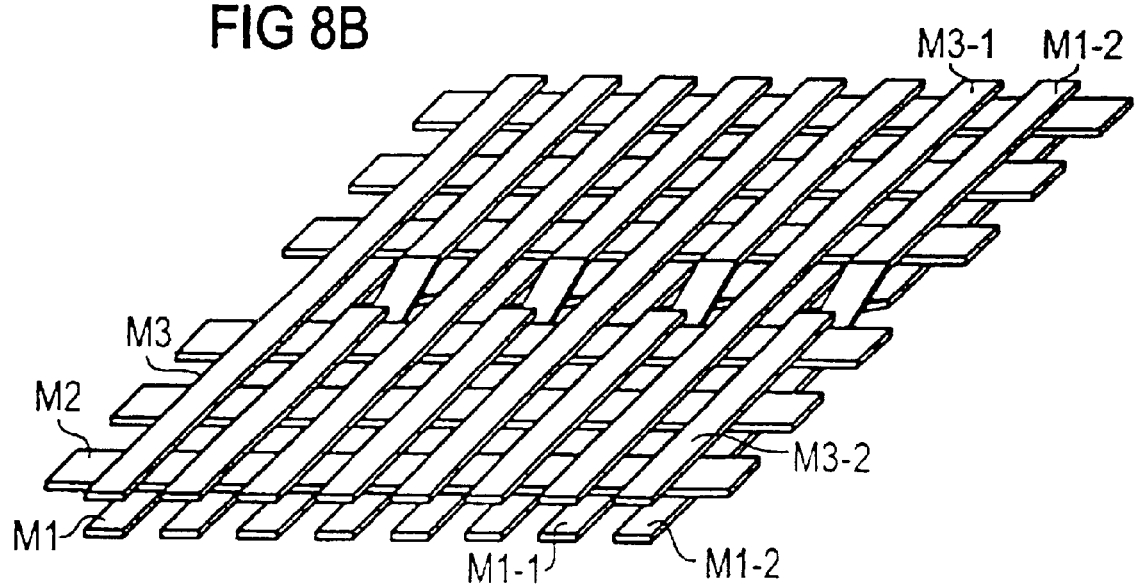
FIG. 8b is a diagrammatic perspective view of two cell arrays according to FIG. 8a with column lines which are crossed with one another.

FIG. 8a shows an embodiment in which two cell arrays are stacked one on top of the other, i.e. there is a row plane M2 and two column planes M1, M3. The column lines M1-1, M3-1 and M1-2 of the planes M1 and M3 respectively run parallel to one another over their entire length. In the configuration according to FIG. 8b, the column lines M1-1 and M3-1 are guided crosswise with one another, so that the column lines M3-1 and M3-2 run directly adjacent only over half of their length, thereby reducing the overcoupling between these two lines.

MRAM memories can also be realized with more than two layers; the concept of crossing column lines lying one above the other, and/or then row lines as well, can be applied mutatis mutandis. It goes without saying that crossings within a cell plane can also be combined with crossings between two cell planes.

It goes without saying that it is also conceivable for the person skilled in the art not only to cross directly adjacent lines but also to change the configurations of lines which are not directly adjacent to one another. What this may mean as a result is that not only some of the adjacent lines change but, depending on the size of the change, up to all of the adjacent lines, as a result of which an even greater decoupling of the lines is obtained.

The features of the invention described with respect to the specific embodiments, the features of the claims and the features shown in the drawings may be essential both individually or in any combination for the realization of the invention in its various embodiments.

We claim:

1. A memory matrix, comprising:
    a first cell array defining a first layer and a second cell array defining a second layer, said first cell array and said second cell array having lines including column lines and row lines, each one of said lines provided in said first layer being disposed substantially opposite to a respective adjacent one of said lines provided in said second layer;
    said column lines and said row lines crossing one another at respective intersection points;
    nonvolatile magnetic TMR memory elements provided at the intersection points; and
    at least one of said column lines contained in said first layer and at least one of said column lines contained in said second layer being parallel with one another in one section and crosswise with one another in another section.

2. The memory matrix according to claim 1, wherein:
    each of said column lines has a respective length; and
    at least one of said column lines multiply crosses, along said respective length, at least two other ones of said column lines disposed next to or opposite to said at least one of said column lines.

3. The memory matrix according to claim 1, wherein:
    each of said row lines has a respective length; and
    at least one of said row lines multiply crosses, along said respective length, at least two other ones of said row lines disposed next to or opposite to said at least one of said row lines.

4. The memory matrix according to claim 1, wherein:
    given ones of said column lines and said row lines are simultaneously activated during a memory access, said given ones of said column lines and said row lines define partial region within said at least one cell array; and
    adjacent ones of said given ones of said column line are crossed with one another only within said partial region.

5. The memory matrix according to claim 1, wherein:
    given ones of said column lines and said row lines are simultaneously activated during a memory access, said given ones of said column lines and said row lines define partial region within said at least one cell array; and
    adjacent ones of said given ones of said row lines are crossed with one another only within said partial region.

6. The memory matrix according to claim 1, wherein:
    said at least one cell array has edges disposed opposite from one another; and
    said column lines have an identical order at said edges.

7. The memory matrix according to claim 1, wherein:
    said at least one cell array has edges disposed opposite from one another; and
    said row lines have an identical order at said edges.

8. A memory matrix, comprising:
    at least one cell array including lines, said lines including column lines and row lines;
    said column lines and said row lines crossing one another at respective intersection points;
    nonvolatile magnetic TMR memory elements provided at the intersection points; and
    at least one of a column line or row line changing a relative position with respect to a respective adjacent column line or row line to ensure that said at least one column line or row line will not be adjacent the same line at another location in said cell array.

9. The memory matrix according to claim 8, wherein said at least two of said lines cross one another.

10. The memory matrix according to claim 8, wherein:
    said at least one cell array includes a first cell array defining a first layer and a second cell array defining a second layer;
    said first cell array and said second cell array being stacked on top of each other; and
    each one of said column lines provided in said first layer being disposed substantially opposite to a respective adjacent one of said column lines provided in said second layer.

11. The memory matrix according to claim 8, wherein:
    said at least one cell array includes a first cell array defining a first layer and a second cell array defining a second layer;
    said first cell array and said second cell array being stacked on top of each other; and
    each one of said row lines provided in said first layer being disposed substantially opposite to a respective adjacent one of said row lines provided in said second layer.

12. The memory matrix according to claim 8, wherein:
    each of said column lines has a respective length; and
    at least one of said column lines multiply crosses, along said respective length, at least two other ones of said column lines disposed next to or opposite to said at least one of said column lines.

13. The memory matrix according to claim 8, wherein:
    each of said row lines has a respective length; and
    at least one of said row lines multiply crosses, along said respective length, at least two other ones of said row lines disposed next to or opposite to said at least one of said row lines.

14. The memory matrix according to claim 8, wherein:
    given ones of said column lines and said row lines are simultaneously activated during a memory access, said given ones of said column lines and said row lines define a partial region within said at least one cell array; and
    adjacent ones of said given ones of said column lines are crossed with one another only within said partial region.

15. The memory matrix according to claim 8, wherein:
    given ones of said column lines and said row lines are simultaneously activated during a memory access, said given ones of said column lines and said row lines define a partial region within said at least one cell array; and adjacent ones of said given ones of said row lines are crossed with one another only within said partial region.

16. The memory matrix according to claim 8, wherein:

said at least one cell array has an edge region; and said column lines have respective relative positions with respect to one another, said respective relative positions not changing in said edge region.

17. The memory matrix according to claim 8, wherein:

said at least one cell array has an edge region; and said row lines have respective relative positions with respect to one another, said respective relative positions not changing in said edge region.

* * * * *